(12) United States Patent
Yamaguchi

(10) Patent No.: US 12,347,671 B2
(45) Date of Patent: Jul. 1, 2025

(54) SEMICONDUCTOR DEVICE MANUFACTURING METHOD AND SEMICONDUCTOR DEVICE MANUFACTURING SYSTEM

(71) Applicant: Tokyo Electron Limited, Tokyo (JP)

(72) Inventor: Tatsuya Yamaguchi, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 552 days.

(21) Appl. No.: 17/810,002

(22) Filed: Jun. 30, 2022

(65) Prior Publication Data

US 2023/0010649 A1 Jan. 12, 2023

(30) Foreign Application Priority Data

Jul. 9, 2021 (JP) .................. 2021-114217

(51) Int. Cl.
*H01L 21/02* (2006.01)
*C08G 18/02* (2006.01)
*C08G 18/18* (2006.01)
*C08G 18/32* (2006.01)

(52) U.S. Cl.
CPC ........ *H01L 21/02118* (2013.01); *C08G 18/02* (2013.01); *C08G 18/18* (2013.01); *C08G 18/325* (2013.01); *H01L 21/022* (2013.01); *H01L 21/02247* (2013.01); *H01L 21/02255* (2013.01)

(58) Field of Classification Search
CPC ............ H01L 21/02118; H01L 21/022; H01L 21/02255; H01L 21/67167; C08G 18/02; C08G 18/18; C08G 18/022; C08G 18/3234; C08G 18/325; C08J 2375/02
See application file for complete search history.

(56) References Cited

U.S. PATENT DOCUMENTS

2004/0220369 A1* 11/2004 Chen .................. C08G 18/10
528/44

FOREIGN PATENT DOCUMENTS

JP 2019-080000 A 5/2019

* cited by examiner

*Primary Examiner* — David Vu
*Assistant Examiner* — Brandon C Fox
(74) *Attorney, Agent, or Firm* — Armstrong Teasdale LLP

(57) ABSTRACT

A method of manufacturing a semiconductor device, includes forming a sacrificial film made of a polymer having a urea bond on a substrate by supplying an amine and an isocyanate to a surface of the substrate, wherein the sacrificial film is provided in a specific region of the substrate; performing a predetermined process on the substrate on which the sacrificial film is formed; and removing the sacrificial film by heating the substrate to depolymerize the polymer, wherein a carbon bonded to a nitrogen atom contained in an isocyanate group of the isocyanate is a secondary or tertiary non-aromatic carbon.

20 Claims, 21 Drawing Sheets

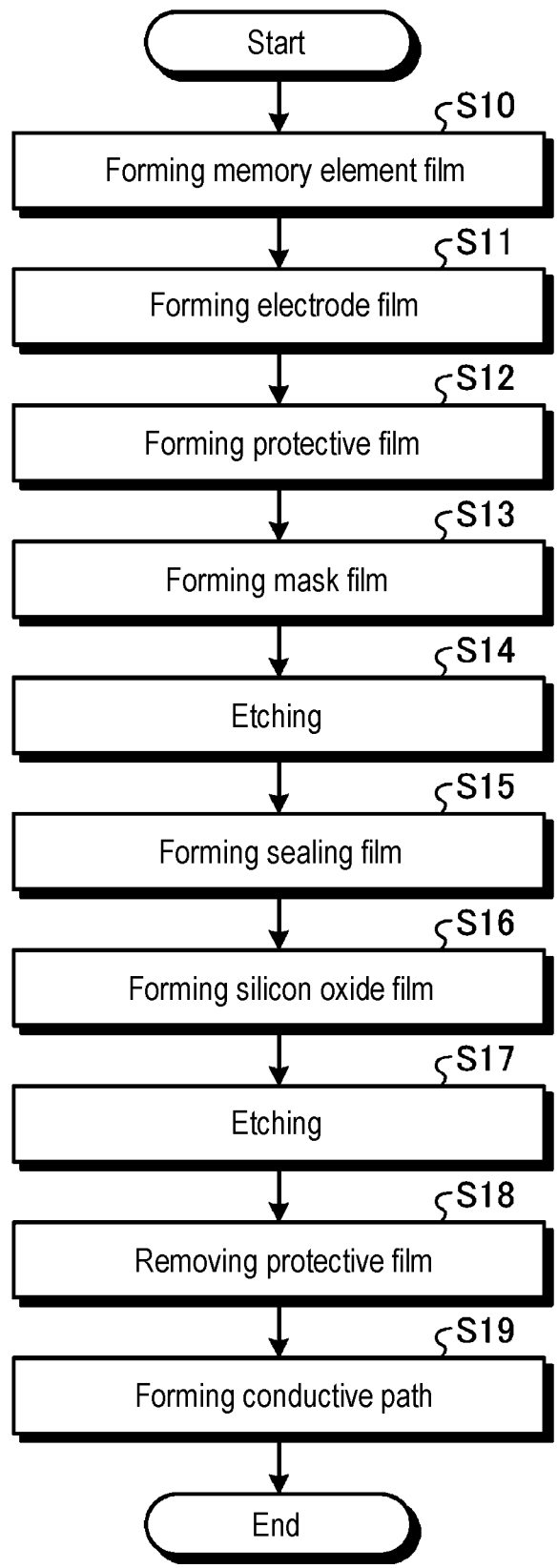

FIG. 11

| | Comparative example | Example 1 | Example 2 | Example 3 | Example 4 |
|---|---|---|---|---|---|
| Isocyanate | OCN—⌬—NCO | OCN—⌬—NCO | OCN~~~NCO | OCN~~~NCO | OCN~~~NCO |
| Amine | $H_2N$—⌬—$NH_2$ | $H_2N$—⌬—$NH_2$ | $H_2N$—⌬—$NH_2$ | $H_2N$—⌬—$NH_2$ | $H_2N$~~~$NH_2$ |

FIG. 12

| | Example 5 | Example 6 | Example 7 | Example 8 |
|---|---|---|---|---|
| Isocyanate | OCN~~~NCO | OCN~~~NCO | OCN~~~NCO | OCN~~~NCO |
| Amine | $H_2N$~~~N($CH_3$)~~~$NH_2$ | $CH_3$–NH~~~NH–$CH_3$ | $CH_3CH_2$–NH~~~NH–$CH_2CH_3$ | $CH_3$–N($CH_3$)~~~N($CH_3$)–$CH_3$ |

FIG. 19

| | Example 9 | Example 10 | Example 11 | Example 12 | Example 13 |
|---|---|---|---|---|---|
| Structure | Ph-NCO | Ph-CH2-NCO | Cy-CH2-NCO | CH3(CH2)3-NCO | Cy-NCO |
| Result | × | × | ○ | △ | ○ |

| | Example 14 | Example 15 | Example 16 |
|---|---|---|---|
| Isocyanate | OCN—⬡—NCO cis/trans | OCN—⬡—NCO trans | OCN—⬡—NCO trans |
| Amine | H₂N—⬡—NH₂ cis/trans | H₂N—⬡—NH₂ cis/trans | H₂N—⬡—NH₂ trans |

SEMICONDUCTOR DEVICE MANUFACTURING METHOD AND SEMICONDUCTOR DEVICE MANUFACTURING SYSTEM

CROSS-REFERENCE TO RELATED APPLICATION

This application is based upon and claims the benefit of priority from Japanese Patent Application No. 2021-114217, filed on Jul. 9, 2021, the entire contents of which are incorporated herein by reference.

TECHNICAL FIELD

Various aspects and embodiments of the disclosure relate to a semiconductor device manufacturing method and a semiconductor device manufacturing system.

BACKGROUND

For example, Patent Document 1 below discloses a technique that laminates a protective film made of a polymer having a urea bond on the surface of a layer to be protected from a specific process, and removes the protective film by heating the substrate after a specific process is performed.

PRIOR ART DOCUMENT

Patent Document

Patent Document 1: Japanese Laid-Open Patent Publication No. 2019-080000

SUMMARY

According to one embodiment of the present disclosure, there is provided a method of manufacturing a semiconductor device, which includes: forming a sacrificial film made of a polymer having a urea bond on a substrate by supplying an amine and an isocyanate to a surface of the substrate, wherein the sacrificial film is provided in a specific region of the substrate; performing a predetermined process on the substrate on which the sacrificial film is formed; and removing the sacrificial film by heating the substrate to depolymerize the polymer, wherein a carbon bonded to a nitrogen atom contained in an isocyanate group of the isocyanate is a secondary or tertiary non-aromatic carbon.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating an example of a semiconductor device manufacturing process in an embodiment of the present disclosure.

FIG. 11 is a view illustrating examples of combinations of an isocyanate and an amine as materials for the protective film.

FIG. 12 is a view illustrating examples of combinations of an isocyanate and an amine as materials for the protective film.

FIG. 19 is a view illustrating examples of experimental results of self-polymerization of an isocyanate.

DETAILED DESCRIPTION

Hereinafter, embodiments of a semiconductor device manufacturing method and a semiconductor device manufacturing system disclosed herein will be described in detail with reference to the drawings. The following embodiments do not limit the semiconductor device manufacturing method and the semiconductor device manufacturing system disclosed herein. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

When a substrate on which a sacrificial film made of a polymer having a urea bond is formed is heated to a temperature at which the polymer is depolymerized, the sacrificial film of the polymer is depolymerized. Then, the sacrificial film of the polymer is decomposed into monomers and removed from the substrate. Polymerization and depolymerization are reversible equilibrium reactions, and as the temperature rises, depolymerization becomes dominant. Therefore, when the substrate is heated to a sufficiently high temperature, the polymer is depolymerized into monomers so that residues can be suppressed.

However, in a semiconductor device manufacturing process, a heat-sensitive material may be used. Therefore, even when removing the sacrificial film, it may be difficult to heat the substrate to a very high temperature. As a result, the polymer may not be sufficiently removed and residues may be generated on the substrate.

Therefore, the present disclosure provides a technique capable of reducing residues in the removal of a sacrificial film.

First Embodiment

[Semiconductor Device Manufacturing Method]

FIG. 1 is a flowchart illustrating an example of a semiconductor device manufacturing method in an embodiment of the present disclosure. FIG. 1 illustrates a method of manufacturing a memory element as an example of a semiconductor device. Examples of the memory element include ReRAM, PcRAM, MRAM, and the like. Hereinafter, the semiconductor device manufacturing method exemplified in FIG. 1 will be described with reference to FIGS. 2A to 5C.

Figure 2A:
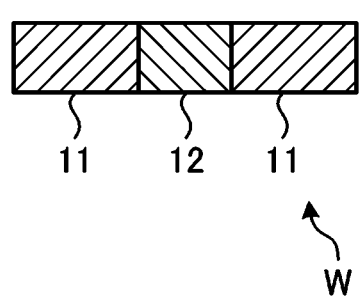
FIGS. 2A to 2D are views illustrating a semiconductor device manufacturing process.

The outline of the process exemplified in FIG. 1 will be described later. A contact hole for embedding a metal serving as a conductive path of a memory element is formed in a substrate W for manufacturing the memory element. By forming the protective film formed of a polymer containing a urea bond at a position where the contact hole is formed, an electrode film formed in an underlayer of the protective film is protected from damage by overetching damage which may be caused when forming the contact hole. This protective film is a sacrificial film. After the formation of the contact hole, the protective film is removed before the metal serving as the conductive path is embedded. In the process exemplified in FIG. 1, first, as illustrated in FIG. 2A, for example, a substrate W provided with an electrode 12 surrounded by an insulating film 11 is prepared.

Figure 2B:
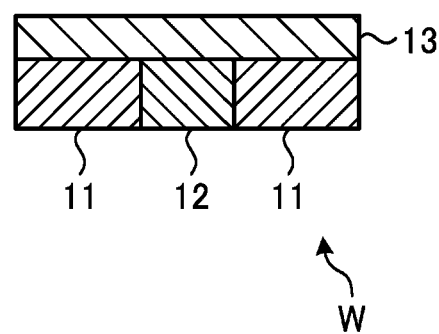
Figure 2C:
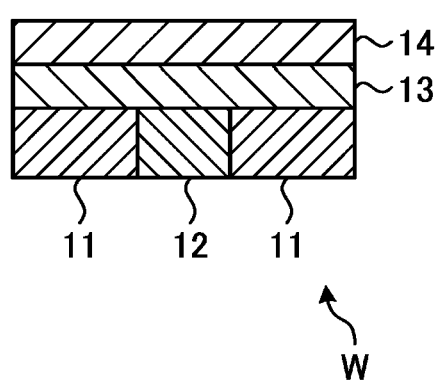

First, for example, as illustrated in FIG. 2B, a memory element film 13 is formed on the substrate W (S10). Examples of the memory element film 13 may include a metal oxide film used for resistive random access memory (ReRAM). Then, for example, as illustrated in FIG. 2C, an electrode film 14 is formed on the memory element film 13 (S11). The electrode film 14 may be a laminated film of titanium nitride and tungsten.

Figure 2D:
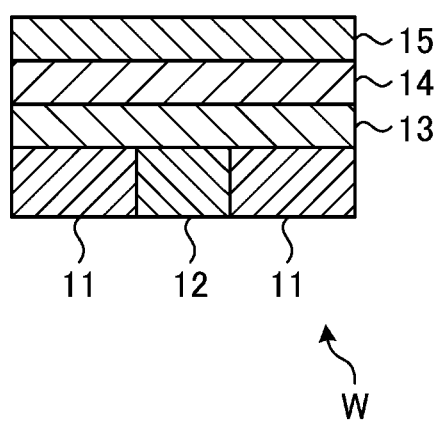
Figure 3:
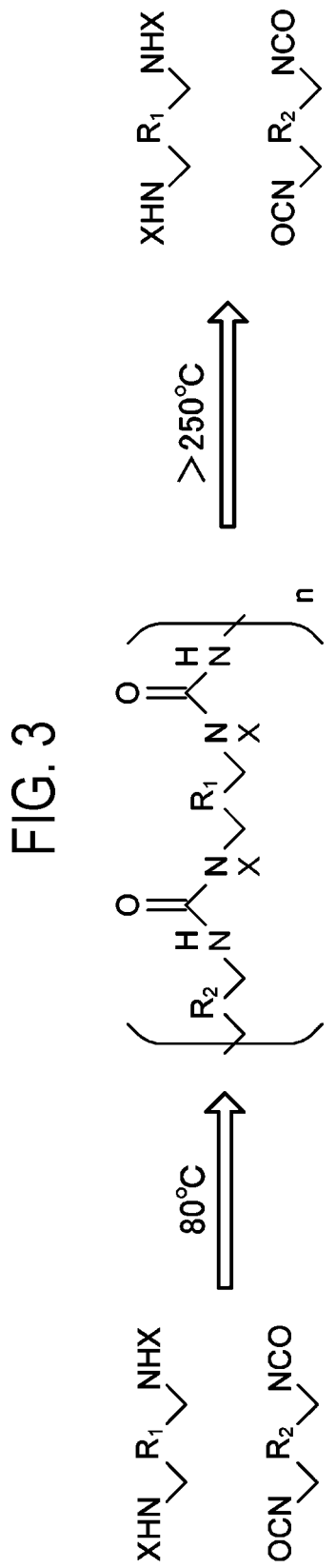
FIG. 3 is a view illustrating an example of a polymer forming process in a first embodiment.

Subsequently, as illustrated in FIG. 2D, for example, a protective film 15 is formed on the electrode film 14 (S12). Step S12 is an example of a forming step. The protective film 15 protects a specific region of the substrate W such as the electrode film 14 from a predetermined process such as etching. In the present embodiment, the protective film 15 is a polyurea film produced through copolymerization using an isocyanate and a secondary amine, for example, as illustrated in FIG. 3. In FIG. 3, $R_1$, $R_2$, and X are, for example, an alkyl group or a cycloalkyl group, and n is an integer of 2 or more. In the present embodiment, the protective film 15 is formed in a state in which the temperature of the substrate W is set to, for example, 80 degrees C. The protective film 15 formed on the substrate W is depolymerized into an isocyanate and a secondary amine when the substrate W is heated to a temperature of 250 degrees C. or higher (e.g., 400 degrees C.) after a predetermined process is performed on the substrate W. As a result, the protective film 15 is removed from the substrate W.

Figure 4A:
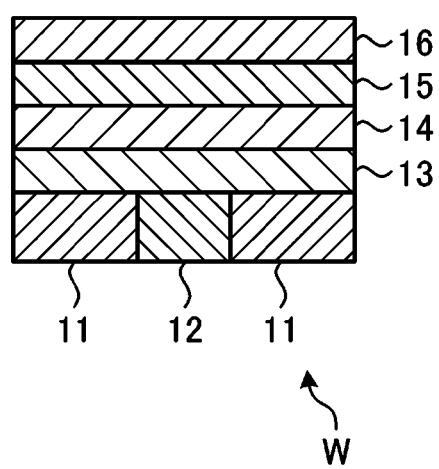
FIGS. 4A to 4D are views illustrating an example of the semiconductor device manufacturing process.
Figure 4B:
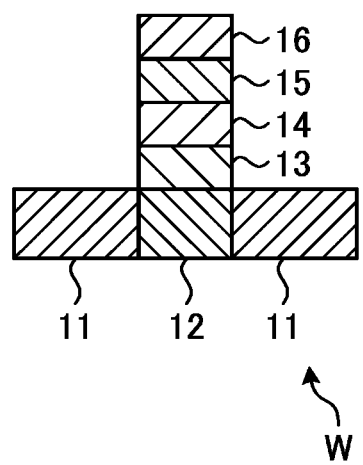

Subsequently, as illustrated in FIG. 4A, for example, a mask film 16 is formed on the protective film 15 (S13). As the mask film 16, for example, a boron-containing silicon film may be used. The boron-containing silicon film is formed by using, for example, a silane-based gas and a $B_2H_6$ gas which is a gas for doping. Then, the substrate W is etched (S14). In step S14, a resist pattern is formed on the mask film 16, and the mask film 16 is etched along the resist pattern. Then, the protective film 15, the electrode film 14, and the memory element film 13 are etched by using the mask film 16 etched along the resist pattern as a hard mask. As a result, for example, the pattern illustrated in FIG. 4B is formed on the substrate W.

Figure 4C:
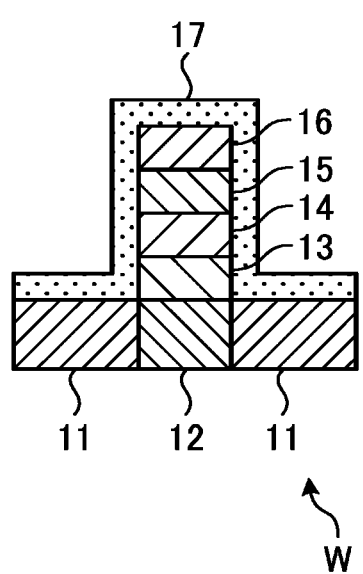

Subsequently, as illustrated in FIG. 4C, for example, a sealing film 17 is formed to cover the surface of the laminate including the mask film 16, the protective film 15, the electrode film 14, and the memory element film 13 (S15). The sealing film 17 is, for example, polyimide or the like, and is provided to enhance the heat resistance of the protective film 15.

Figure 4D:
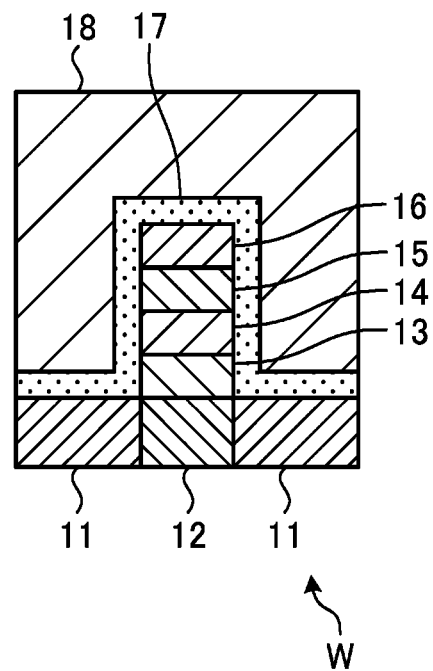

Subsequently, as illustrated in FIG. 4D, for example, a silicon oxide film 18 is formed on the sealing film 17 (S16). The silicon oxide film 18 is used as an element separation film for electrically separating elements from each other. The silicon oxide film 18 is formed through chemical vapor deposition (CVD) at, for example, a process temperature of 300 degrees C. in a vacuum atmosphere.

Figure 5A:
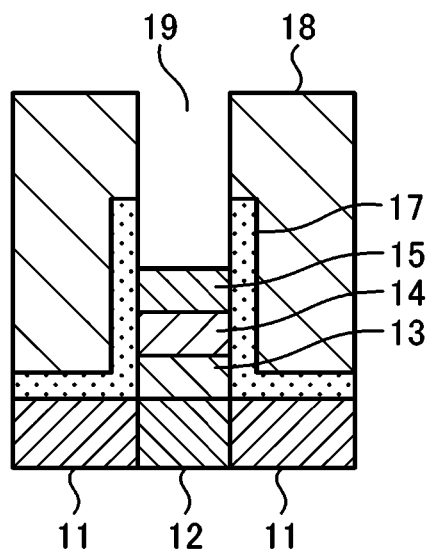
FIGS. 5A to 5C are views illustrating an example of the semiconductor device manufacturing process.

Subsequently, the substrate W is etched to form a contact hole 19, for example, as illustrated in FIG. 5A (S17). Step S17 is an example of a processing step. In step S17, a mask having an opening is formed on the silicon oxide film 18, and the substrate W is etched through the mask until the protective film 15 is exposed. As a result, the contact hole 19 is formed at a position corresponding to the opening of the mask.

Figure 5B:
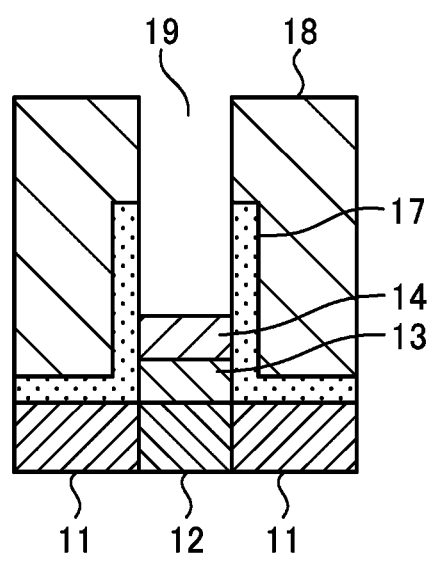
Figure 5C:
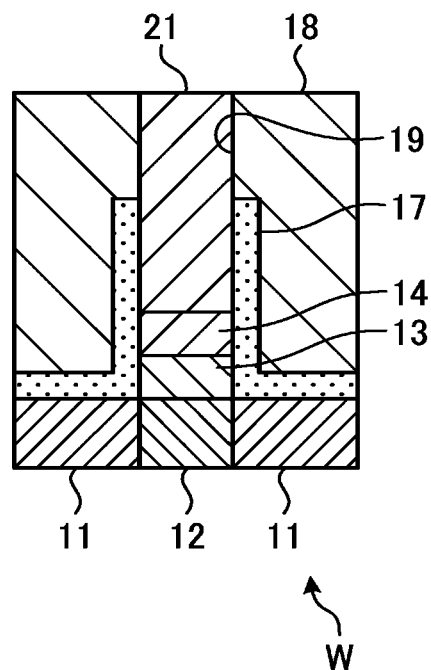

Subsequently, when the substrate W is heated, the protective film 15 is depolymerized, and the protective film 15 is removed, for example, as illustrated in FIG. 5B (S18). Step S18 is an example of a removing step. Then, for example, as illustrated in FIG. 5C, a conductive path 21 is formed in the contact hole 19 (S19). In step S19, for example, a metal such as copper is embedded in the contact hole 19, and an excess metal is removed through chemical mechanical polishing (CMP) to form a conductive path 1. Then, the semiconductor device manufacturing method illustrated in this flowchart is completed.

[Manufacturing System 10)

Figure 6:
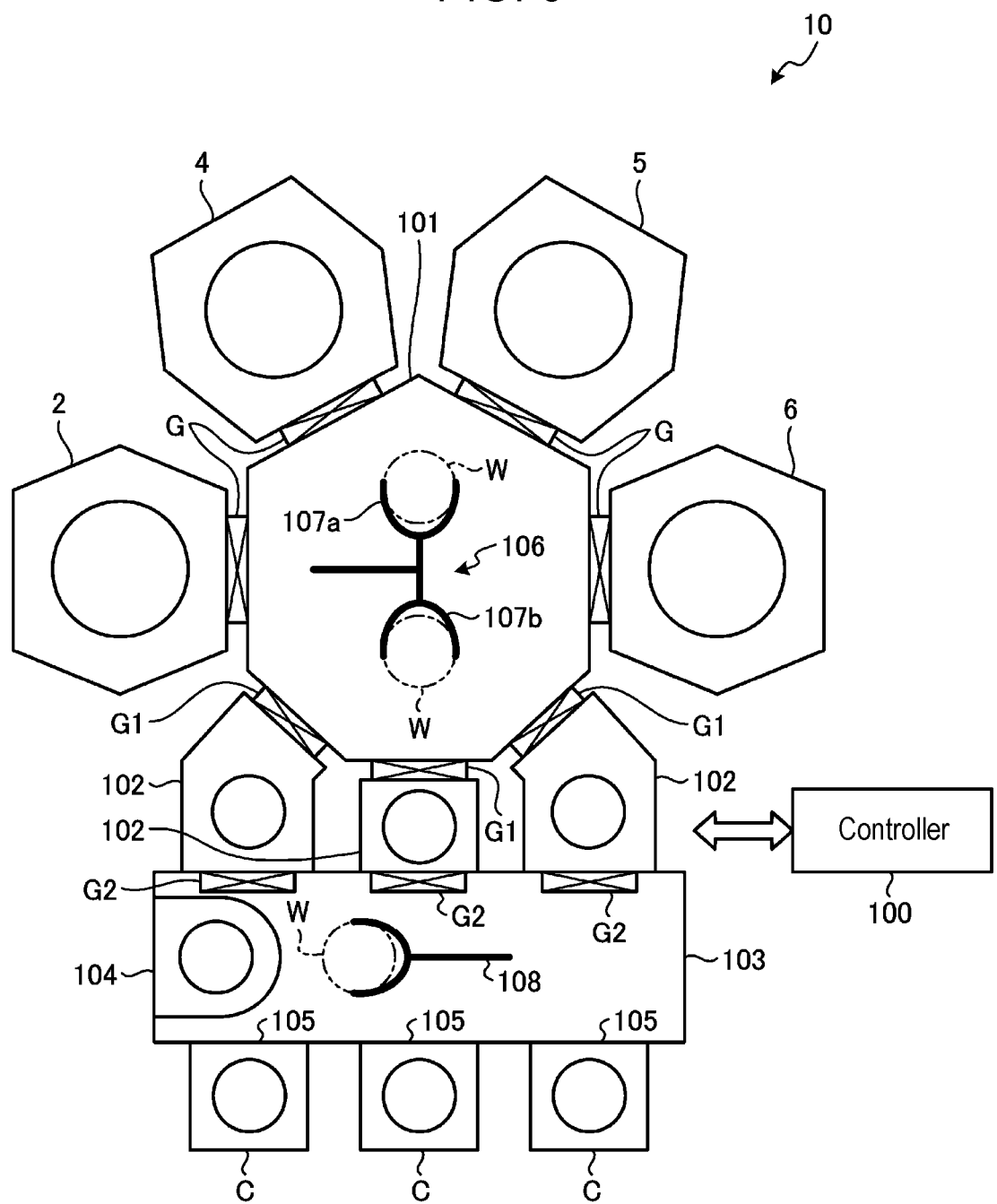
FIG. 6 is a view illustrating a configuration of an example of a manufacturing system in an embodiment of the present disclosure.

The manufacturing method exemplified in FIG. 1 is implemented by, for example, a manufacturing system 10 illustrated in FIG. 6. FIG. 6 is a view illustrating a configuration of an example of the manufacturing system 10 according to an embodiment of the present disclosure. The manufacturing system 10 includes a first film forming apparatus 2, a second film forming apparatus 4, an etching apparatus 5, and a heat treatment apparatus 6. The manufacturing system 10 is a multi-chamber-type vacuum processing system. The manufacturing system 10 manufactures a semiconductor device by using the first film forming apparatus 2, the second film forming apparatus 4, the etching apparatus 5, and the heat treatment apparatus 6.

The first film forming apparatus 2 forms a predetermined film on the substrate W. The first film forming apparatus 2 executes, for example, the processes of steps S10, S11, S13, S15, S16, and S19 in the manufacturing method exemplified in FIG. 1. The second film forming apparatus 4 forms the protective film 15 of a polymer containing a urea bond on the substrate W. The second film forming apparatus 4 executes, for example, the process of step S12 in the manufacturing method exemplified in FIG. 1. The etching apparatus 5 performs etching on the substrate W. The etching apparatus 5 performs, for example, the processes of steps S14 and S17 in the manufacturing method exemplified in FIG. 1. The etching apparatus 5 is an example of a processing apparatus. The heat treatment apparatus 6 performs a process of removing the protective film 15 by heating the substrate W. The heat treatment apparatus 6 executes, for example, the process of step S18 in the manufacturing method exemplified in FIG. 1.

The first film forming apparatus 2, the second film forming apparatus 4, the etching apparatus 5, and the heat treatment apparatus 6 are connected to four sidewalls of a vacuum transfer chamber 101 having a heptagonal planar shape via gate valves G, respectively. Three load-lock chambers 102 are connected to the other three sidewalls of the vacuum transfer chamber 101 via gate valves G1, respectively. The three load-lock chambers 102 are connected to an atmospheric transfer chamber 103 via gate valves G2, respectively.

The interior of the vacuum transfer chamber 101 is evacuated by a vacuum pump, and is maintained at a predetermined degree of vacuum. Within the vacuum transfer chamber 101, a transfer device 106, such as a robot arm, is provided. The transfer device 106 transfers substrates W among the first film forming apparatus 2, the second film forming apparatus 4, the etching apparatus 5, the heat treatment apparatus 6, and each load-lock chamber 102. The transfer device 106 includes two arms 107a and 107b, which are independently movable.

A side surface of the atmospheric transfer chamber 103 is provided with a plurality of ports 105, in each of which a carrier (e.g., a front-opening unified pod (FOUP)) C for accommodating substrates W is placed. In addition, on a sidewall of the atmospheric transfer chamber 103, an alignment chamber 104 is provided so as to perform alignment of the substrates W. A downflow of clean air is formed in the atmospheric transfer chamber 103.

A transfer device 108, such as a robot arm, is provided in the atmospheric transfer chamber 103. The transfer device 108 transfers substrates W among each carrier C, each load-lock chamber 102, and the alignment chamber 104.

A controller 100 includes a memory, a processor, and an input/output interface. The memory stores, for example, a program executed by the processor and a recipe including conditions for each process. The processor executes a program read from the memory and controls each part of the manufacturing system 10 via the input/output interface on the basis of a recipe stored in the memory.

[Configuration of Second Film Forming Apparatus 4]

Figure 7:
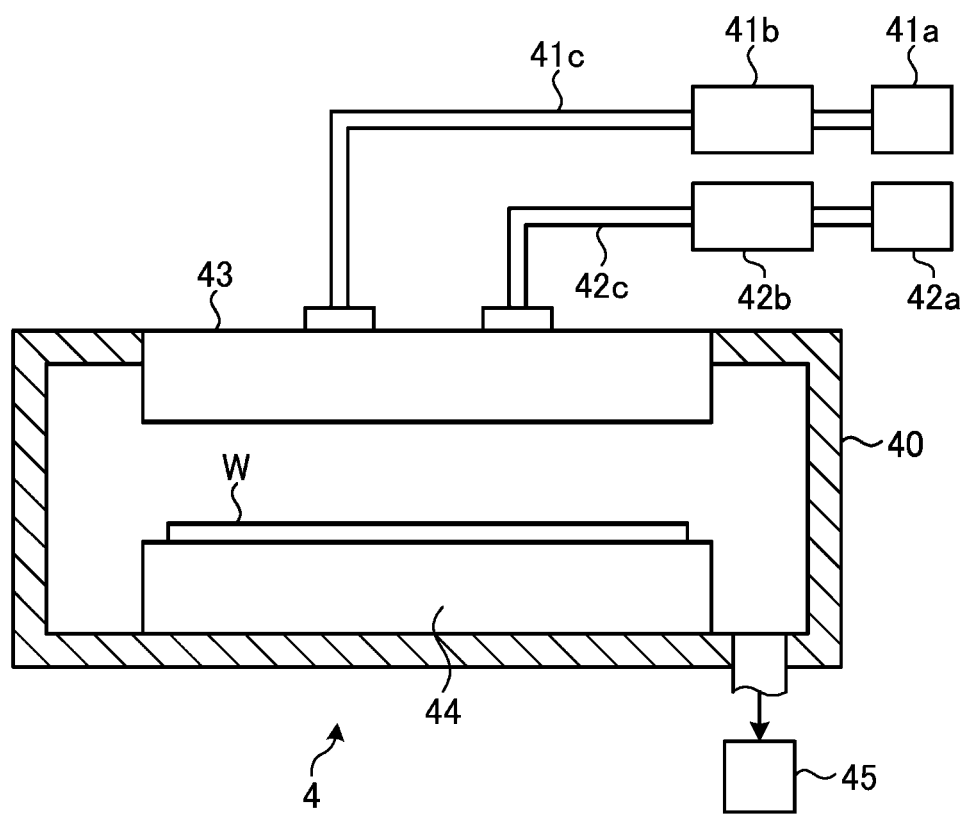
FIG. 7 is a schematic view illustrating an example of a second film forming apparatus for forming a protective film.

FIG. 7 is a schematic view illustrating an example of a second film forming apparatus 4 for forming the protective film 15. The second film forming apparatus 4 includes a vacuum container 40 that partitions a vacuum atmosphere. A stage 44 on which the substrate W is placed is provided in the vacuum container 40. The stage 44 is provided with a temperature control mechanism for setting the temperature of the substrate W to a predetermined temperature. A shower head 43 is provided in the upper portion of the vacuum container 40. In addition, in the lower portion of the vacuum container 40, an exhaust mechanism 45 for exhausting the gas in the vacuum container 40 to control the interior of the vacuum container 40 to a predetermined pressure is provided.

A raw material source 41a stores an isocyanate liquid which is a raw material monomer. A raw material source 42a stores an amine liquid, which is a raw material monomer. A vaporizer 41b vaporizes the isocyanate liquid stored in the raw material source 41a and supplies the isocyanate vapor to the shower head 43 via a pipe 41c. The vaporizer 42b vaporizes the amine liquid stored in the raw material source 42a and supplies the amine vapor to the shower head 43 via a pipe 42c. The isocyanate and amine vapors supplied to the shower head 43 are supplied into the vacuum container 40 in the form of a shower. A large number of ejection holes are formed in the bottom surface of the shower head 43, and the isocyanate vapor and the amine vapor are ejected into the vacuum container 40 from separate ejection holes. The isocyanate vapor and the amine vapor supplied into the vacuum container 40 polymerize on the substrate W to form the protective film 15 having a urea bond.

Figure 8:
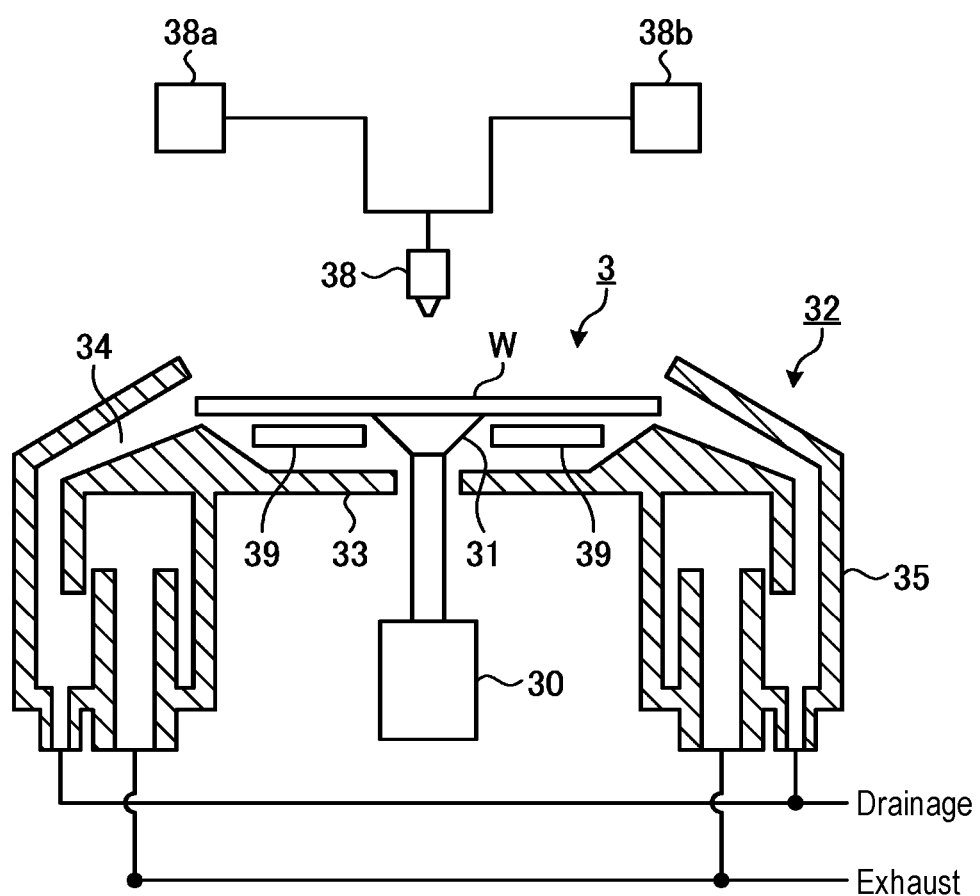
FIG. 8 is a schematic view illustrating an example of a coating apparatus for forming the protective film.

The protective film 15 may be formed on the substrate W by, for example, a coating apparatus 3 illustrated in FIG. 8. FIG. 8 is a schematic view illustrating an example of the coating apparatus 3 for forming the protective film 15. The coating apparatus 3 includes a vacuum chuck 31, a cup module 32, a guide member 33, and a discharge space 34. The vacuum chuck 31 suctions and holds the substrate W and is rotated by a rotation mechanism 30. The guide member 33 has a structure in which an outer peripheral wall and an inner peripheral wall extending downward are formed in a cylindrical shape. The discharge space 34 is formed between the outer cup 35 and the outer peripheral wall so that exhaust and drainage can be performed over the entire circumference. The lower side of the discharge space 34 has a structure that allows gas-liquid separation. A heating part 39 made of, for example, a light-emitting diode is disposed below the vacuum chuck 31, and the substrate W is heated to a predetermined temperature by the heating part 39.

A raw material source 38a stores an isocyanate liquid which is a raw material monomer. A raw material source 38b stores an amine liquid, which is a raw material monomer. The nozzle 38 mixes the isocyanate liquid stored in the raw material source 38a and the amine liquid stored in the raw material source 38b and supplies the mixture to the center of the substrate W. Then, the substrate W held by the vacuum chuck 31 is rotated by the rotation mechanism 30, so that the mixed liquid supplied on the substrate W spreads over the entire top surface of the substrate W, and the protective film 15 is formed on the top surface of the substrate W.

[Configuration of Etching Apparatus 5]

Figure 9:
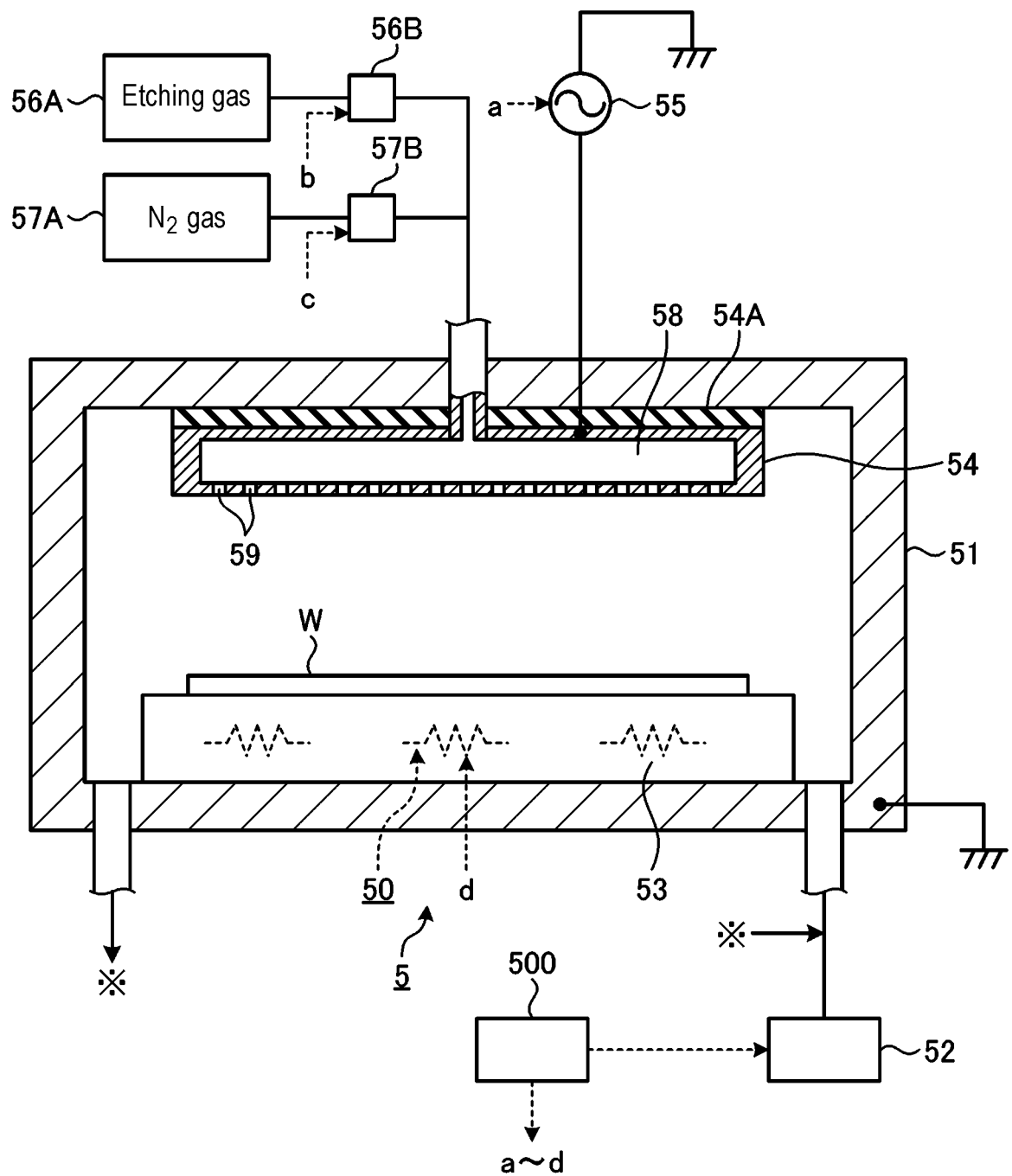
FIG. 9 is a schematic view illustrating an example of an etching apparatus.

FIG. 9 is a schematic view illustrating an example of the etching apparatus 5. The etching apparatus 5 illustrated in FIG. 9 is capable of performing etching by using capacitively coupled plasma. The etching apparatus 5 includes a processing container 51 made of a conductive material. The processing container 51 is grounded. An exhaust mechanism 52 is connected to the processing container 51, and the gas in the processing container 51 is exhausted by the exhaust mechanism 52, so that the interior of the processing container 51 is controlled to a predetermined pressure.

A stage 53 on which the substrate W is placed is provided in the processing container 51. A heater 50 for heating the substrate W is provided in the stage 53. The stage 53 is electrically connected to the bottom portion of the processing container 51 and functions as an anode electrode. A shower head 54 is provided above the stage 53 to face the top surface of the stage 53. The shower head 54 is supported on the upper portion of the processing container 51 via an insulating member 54A. A power source 55 for supplying radio-frequency power for plasma generation is connected to the shower head 54. The shower head 54 functions as a cathode electrode with respect to the stage 53.

A gas source 56A supplies an etching gas. The gas source 57A supplies an inert gas such as a $N_2$ gas. A flow rate controller 56B adjusts a flow rate of the etching gas supplied from the gas source 56A and supplies the etching gas into a diffusion space 58 in the shower head 54. A flow rate controller 57B adjusts a flow rate of the inert gas supplied from the gas source 57A and supplies the inert gas into the diffusion space 58 in the shower head 54. The gas supplied into the diffusion space 58 diffuses in the diffusion space 58 and is supplied in the form of a shower into the processing container 51 from a plurality of ejection ports 59 formed in the bottom surface of the diffusion space 58.

The etching apparatus 5 includes a controller 500. The controller 500 includes a memory, a processor, and an input/output interface. The memory stores, for example, a program executed by the processor and a recipe including conditions for each process. The processor executes the program read from the memory and controls each part of the etching apparatus 5 via the input/output interface based on the recipe stored in the memory. Specifically, the processor controls ON/OFF of the power source 55, the exhaust amount of the exhaust mechanism 52, the flow rates of the gases supplied by the flow rate controllers 56B and 57B, the power supplied to the heater 50, and the like.

For example, the substrate W on which the silicon oxide film 18 is formed (see FIG. 4D) is carried into the processing container 51 of the etching apparatus 5 and placed on the stage 53. Although not illustrated in FIG. 4H, a mask having an opening formed in a region corresponding to the contact hole 19 is provided on the silicon oxide film 18. Then, when the interior of the processing container 51 is evacuated by the exhaust mechanism 52 so that the interior of the processing container 51 has a predetermined pressure, the etching gas for forming the contact hole 19 is ejected from the shower head 54, and radio-frequency power is supplied to the shower head 54 from the power source 55. As a result, an electric field is formed between the shower head 54 and the stage 53, and the etching gas is turned into plasma. Then, the silicon oxide film 18 is etched by ions and active species contained in the plasma to form the contact hole 19, and the protective film 15 is exposed on the surface of the substrate W. Then, the mask is removed through ashing using plasma or the like, and the surface of the substrate W is turned into, for example, a state illustrated in FIG. 5A. Then, the supply of the etching gas and the supply of the radio-frequency power are stopped, the inert gas is supplied into the processing container 51, and the substrate W is carried out from the processing container 51.

[Configuration of Heat Treatment Apparatus 6]

Figure 10:
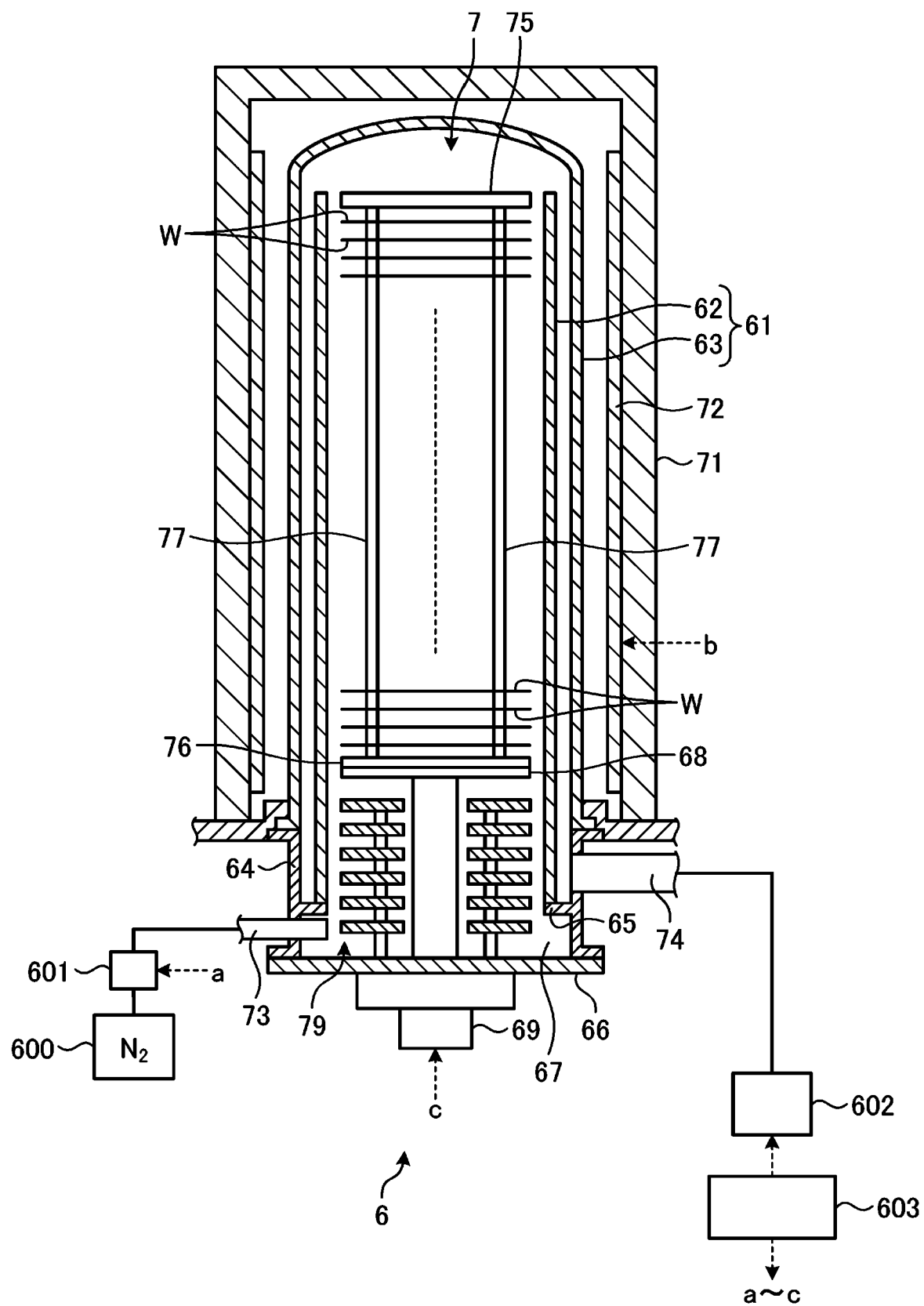
FIG. 10 is a schematic view illustrating an example of a heat treatment apparatus.

FIG. 10 is a schematic view illustrating an example of the heat treatment apparatus 6. The heat treatment apparatus 6 includes a container 61 which is a substantially cylindrical vacuum container, the length direction of which is directed in the vertical direction. The container 61 has a double tube structure including an inner tube 62 and a roofed outer tube 63 that covers the inner tube 62 and is provided to be spaced apart by a certain distance from the inner tube 62. The inner tube 62 and the outer tube 63 are formed of a heat resistant material such as quartz.

Below the outer tube 63, a manifold 64 made of stainless steel and formed in a cylindrical shape is disposed. The manifold 64 is airtightly connected to the lower end of the outer tube 63. In addition, the inner tube 62 protrudes from the inner wall of the manifold 64. The inner tube 62 is supported by a support ring 65 formed integrally with the manifold 64.

A lid 66 is disposed below the manifold 64. The lid 66 is configured to be able to move up and down between a raised position and a lowered position by a boat elevator (not illustrated). In FIG. 10, the lid 66 is located at the raised position, and at this raised position, the lid 66 closes the opening 67 of the container 61 below the manifold 64, and the interior of the container 61 is airtightly maintained. A stage 68 is provided above the lid 66. A boat 7, which is a substrate holder, is placed on the stage 68. A heat insulating material 79 is provided between the stage 68 and the lid 66. In addition, the lid 66 is provided with a rotation mechanism 69. The rotation mechanism 69 rotates the stage 68 around a vertical axis during the heat treatment of a substrate W.

A heat insulator 71 is provided around the container 61 to surround the container 61. On the inner wall surface of the heat insulator 71, for example, a heater 72 made of a resistance heating element which is a heating part is provided. It is possible to heat the interior of the container 61 by the heater 72. A nozzle 73 is provided below the support ring 65 in the manifold 64. Since the nozzle 73 is connected to a gas source 600 for supplying an inert gas such as a $N_2$ gas via the flow rate controller 601, it is possible to supply the inert gas into the inner tube 62. One end of an exhaust pipe 74 for evacuating the interior of the container 61 is connected to the side surface of the manifold 64 above the support ring 65, and the other end of the exhaust pipe 74 is connected to an exhaust mechanism 602.

The boat 7 includes a ceiling plate 75 and a bottom plate 76 facing each other. The ceiling plate 75 and the bottom plate 76 are formed horizontally, and are horizontally connected to one end and the other end of three columns 77 (only two are exemplified in FIG. 10) extending vertically upward and downward. Each column 77 is provided with a large number of supports (not illustrated) that support the rear surfaces of the substrates W in the vertical direction, and by being supported by the supports, a large number of substrates W are held at intervals in the vertical direction in the form of a shelf.

The heat treatment apparatus 6 includes a controller 603. The controller 603 includes a memory, a processor, and an input/output interface. The memory stores, for example, a program executed by the processor and a recipe including conditions for each process. The processor executes the program read from the memory and controls each part of the heat treatment apparatus 6 via the input/output interface based on the recipe stored in the memory. Specifically, the processor controls the exhaust amount by the exhaust mechanism 602, the flow rate of the inert gas supplied to the container 61 by the flow rate controller 601, the power supplied to the heater 72, and the like.

EXAMPLES

FIGS. 11 and 12 are views illustrating examples of combinations of an isocyanate and an amine as materials for the protective film 15. A comparative example is a combination of an isocyanate having a benzene ring and a primary amine having a cyclohexane ring. Example 1 is a combination of an isocyanate having a cyclohexane ring and a primary amine having a cyclohexane ring. Examples 2 and 3 are combinations of an isocyanate having a chain structure and a primary amine having a cyclohexane ring. Examples 4 and 5 are combinations of an isocyanate having a chain structure and a primary amine having a chain structure. Examples 6 to 8 are combinations of an isocyanate having a chain structure and a secondary amine having a chain structure.

[Experimental Results]

Figure 13:
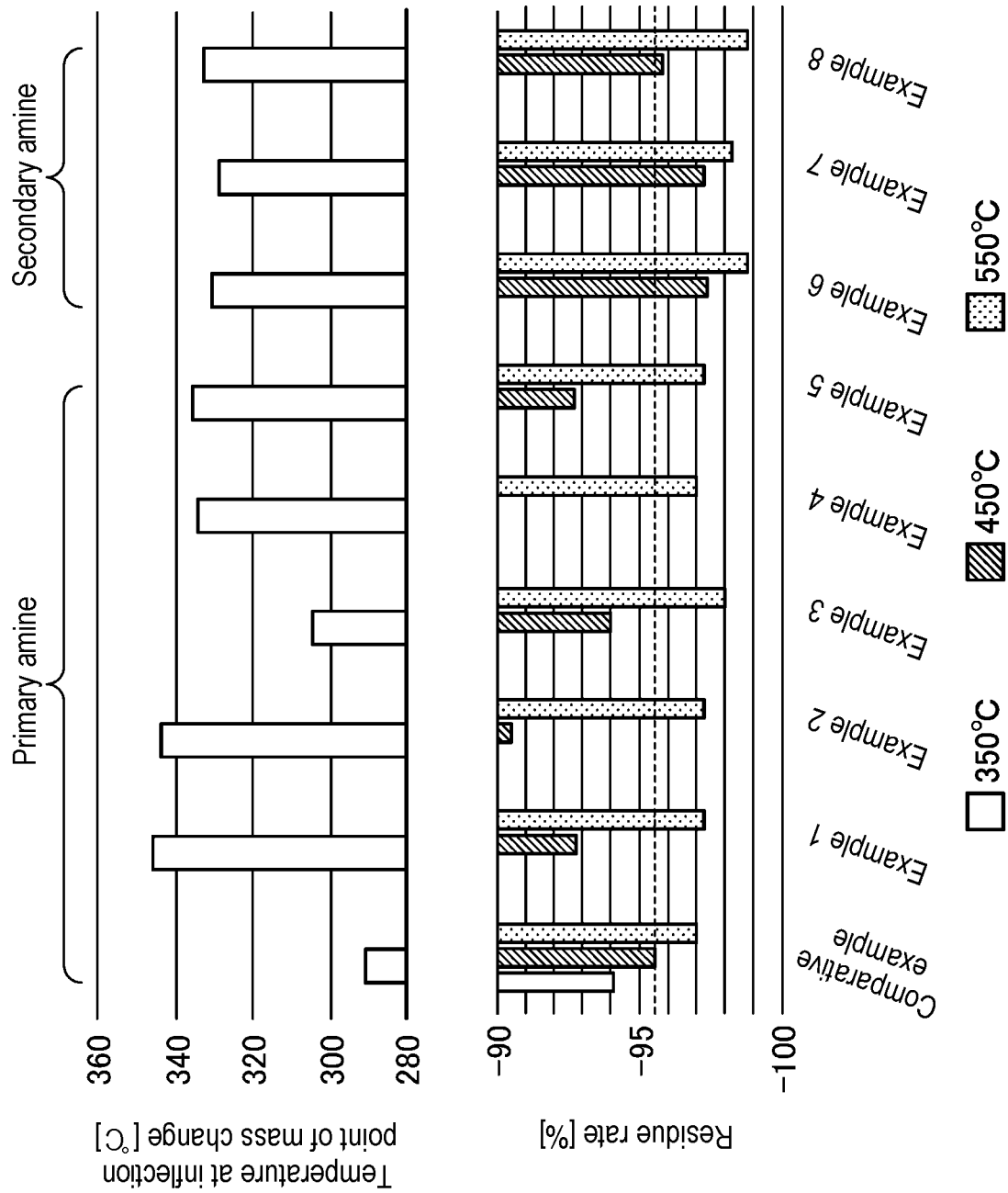
FIG. 13 is a view illustrating examples of temperatures and residue rates at inflection points of mass changes of polymers.

FIG. 13 is a view illustrating examples of temperatures and residue rates at inflection points of mass changes of polymers. As the temperature of a polymer of an isocyanate and an amine polymer increases, a depolymerization reaction is promoted more than a polymerization reaction, and thus the mass of the polymer decreases. A temperature at which the mass of a polymer rapidly decreases with the increase of temperature is an inflection point of a mass change of the polymer.

For example, as illustrated in FIG. 13, in Examples 1 to 8, the temperatures of the inflection points of the mass changes of the polymers are higher than that of Comparative Example. That is, it can be said that the polymers of Examples 1 to 8 are superior in temperature stability to that of Comparative Example. Therefore, from the viewpoint of temperature stability, the polymers formed by the combinations of Examples 1 to 8 are preferable.

Regarding the residual ratios of the polymers, for example, as illustrated in FIG. 13, at 550 degrees C., the residual ratios of the polymers are 95% or more in any of the examples. At 450 degrees C., the residue ratios of Comparative Examples and Examples 6 to 8 are 95% or more. In removing the protective film 15, it is preferable that the protective film 15 is removed at a lower temperature in order to suppress the influence on other heat-sensitive structures such as the wiring material provided on the substrate W. In removing the protective film 15, it is preferable that the substrate W is heated to a temperature in the range of, for example, 400 to 500 degrees C. The residue ratios of Examples 6 to 8 are lower than the residue ratio of Comparative Example. Therefore, from the results of FIG. 13, the polymers formed by the combinations of Examples 6 to 8 are preferable from the viewpoint of temperature stability and residue ratio. That is, as the amine, a secondary amine is preferable.

Figure 14:
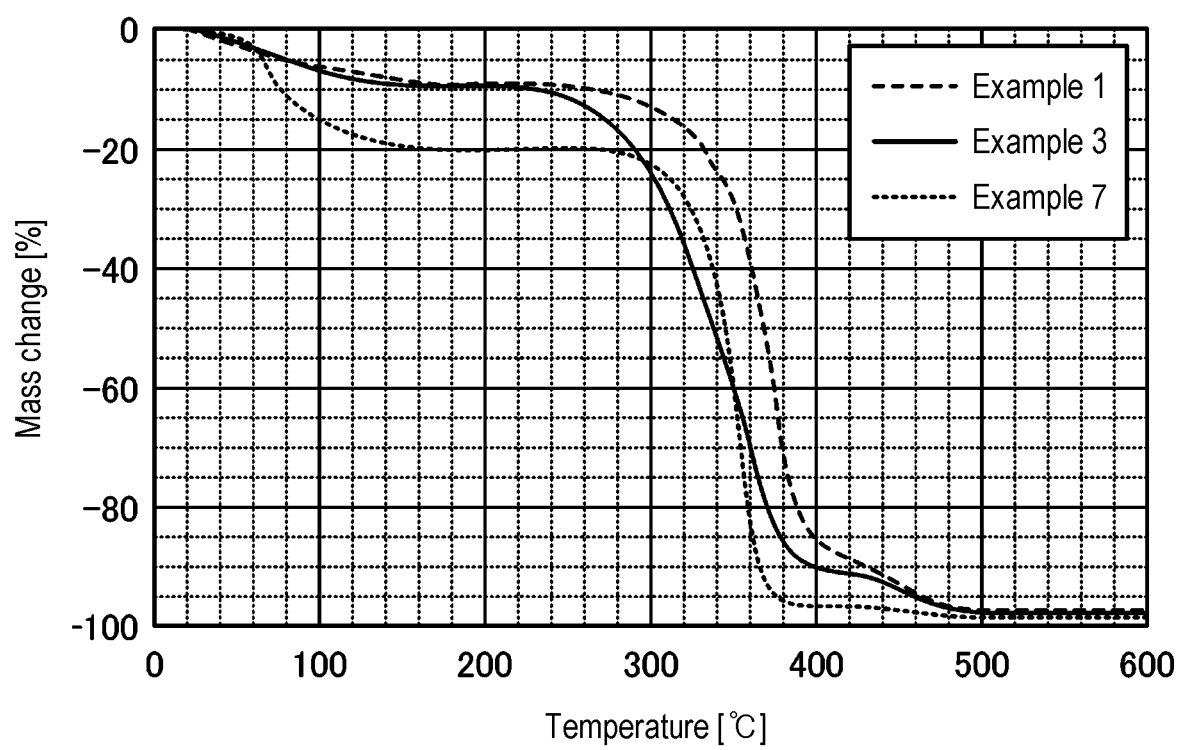
FIG. 14 is a view illustrating examples of mass changes of polymers with respect to a temperature.

FIG. 14 is a view illustrating examples of mass changes of polymers with respect to a temperature. For example, as illustrated in FIG. 14, in Example 7, the mass change of the polymer is 95% or more at around 400 degrees C., and the polymer is almost removed. In Examples 1 and 3, the mass changes are smaller and the residues are larger than in those in Example 7 at around 400 degrees C. Therefore, in terms of removing a polymer at a lower temperature, the polymers formed by the combinations of Examples 7 are preferable to the polymers formed by the combination of Examples 1 and 3.

Figure 15:
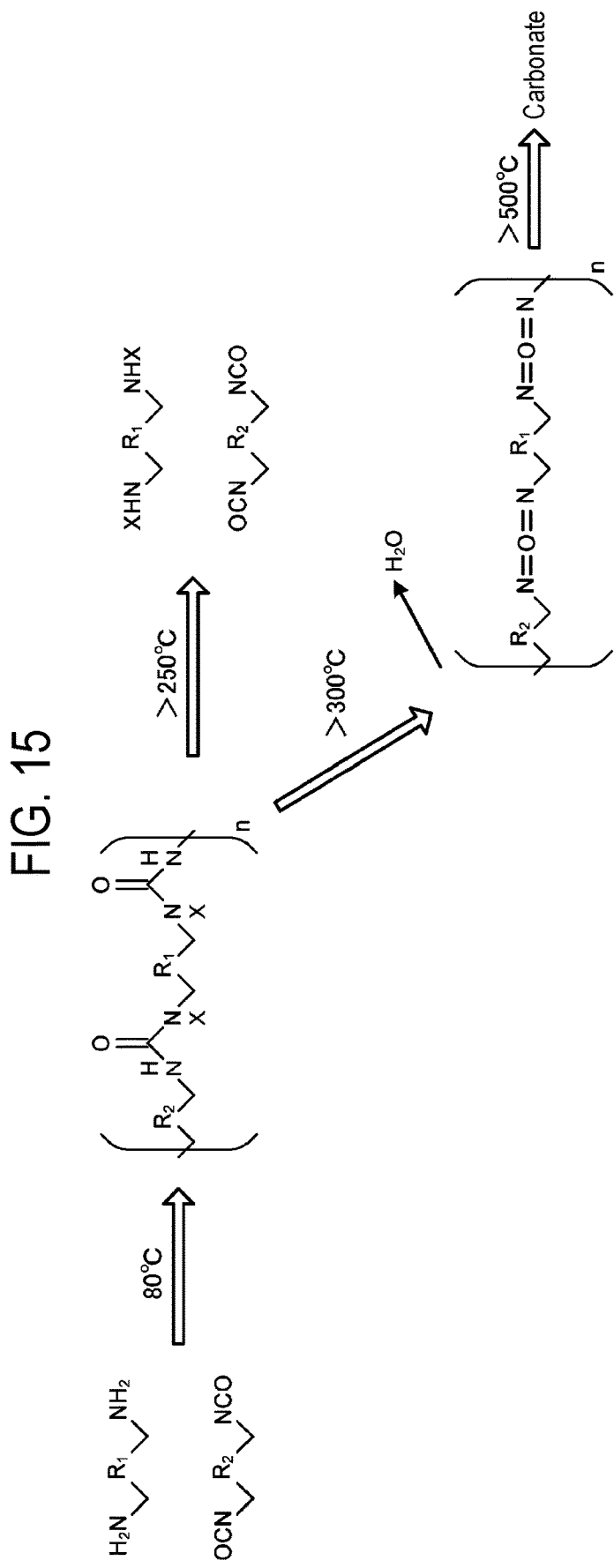
FIG. 15 is a view illustrating an example of a polymer forming process when a primary amine is used.

Here, a polymer formed by an isocyanate and an amine is depolymerized into an isocyanate and an amine when heated. However, in a combination of an isocyanate and a primary amine, for example, as illustrated in FIG. 15, a dehydration reaction may occur in the process of heating the polymer, and another polymer containing a carbodiimide may be produced. Since such a polymer is not depolymerized even when heated, the polymer is not removed even when heated and is turned into a carbide. Therefore, it is considered that a combination of an isocyanate and a primary amine will increase residues compared to a combination of an isocyanate and a secondary amine. Therefore, from the viewpoint of suppressing residues, the combination of an isocyanate and a secondary amine is preferable.

Figure 16A:
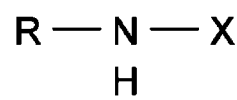
FIGS. 16A and 16B are views each illustrating an example of a basic skeleton of an amine.
Figure 16B:
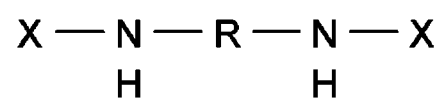
Figure 17B:
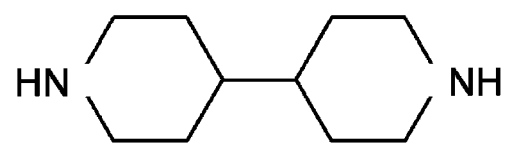
FIGS. 17A and 17B are views each illustrating another example of a structure of a secondary amine.
Figure 17A:

Examples of basic skeletons of such a secondary amine include a monofunctional amine, for example, as illustrated in FIG. 16A and a bifunctional amine, for example, as illustrated in FIG. 16B. R and X indicated in FIGS. 16A and 16B are, for example, an alkyl group or a cycloalkyl group. As the secondary amine, for example, compounds as illustrated in FIGS. 17A and 17B may be considered.

Second Embodiment

Figure 18:
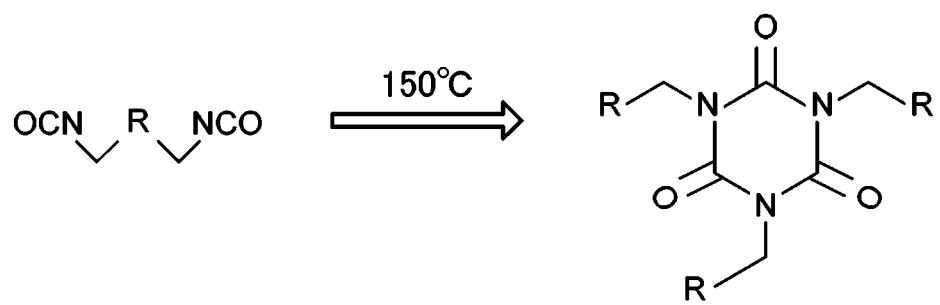
FIG. 18 is a view illustrating an example of a self-polymerization process of an isocyanate.

In the first embodiment, the protective film 15 of a polymer having a urea bond is formed by the combination of the isocyanate and the secondary amine. The isocyanate may cause self-polymerization at a temperature of about 150 degrees C., for example, as illustrated in FIG. 18. The self-polymerized isocyanate polymer does not return to the original isocyanate even when heated and is turned into residues. Therefore, in terms of reducing the residues when the protective film 15 is removed by heating, it is preferable to form the protective film 15 by using an isocyanate having a structure that is difficult to self-polymerize. In the present embodiment, the protective film 15 is formed by using an isocyanate having a structure that is difficult to self-polymerize.

[Experimental Results]

FIG. 19 is a view illustrating examples of experimental results of self-polymerization of an isocyanate. In the experiment, an isocyanate liquid was maintained at 150 degrees C. for one month, and it was determined whether self-polymerization occurred based on the presence or absence of discoloration. In Example 9, an isocyanate having a structure in which an isocyanate group is bonded to a benzene ring was used. In Example 10, an isocyanate having a structure in which an isocyanate group is bonded to a benzene ring via carbon was used. In Example 11, an isocyanate having a structure in which an isocyanate group is bonded to a cyclohexane ring via carbon was used. In Example 12, an isocyanate having a chain structure was used. In Example 13, an isocyanate having a structure in which an isocyanate group is bonded to a cyclohexane ring was used.

As illustrated in FIG. 19, in the isocyanates of Examples 9 and 10, discoloration was observed and self-polymerization occurred. In the isocyanate of Example 12, slight discoloration was observed and slight self-polymerization occurred. In the isocyanates of Examples 11 and 13, no discoloration was observed, and it is considered that self-polymerization did not substantially occur. That is, by using the isocyanates of Examples 11 to 13, it is possible to reduce residues compared with the case of using the isocyanates of Example 9 or 10.

Figure 20:
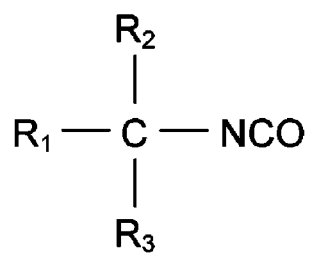
FIG. 20 is a view illustrating an example of a basic skeleton of an isocyanate.

The isocyanates of Examples 11 to 13 structurally have something in common, for example, as illustrated in FIG. 20. FIG. 20 is a view illustrating an example of a basic skeleton of an isocyanate. In FIG. 20, two of $R_1$ to $R_3$ are carbon compounds, and the remaining one is a carbon compound or a hydrogen atom. That is, in the basic skeleton of isocyanate illustrated in FIG. 20, the nitrogen atom contained in the isocyanate group is bonded to a secondary or tertiary non-aromatic carbon. The non-aromatic carbon is, for example, carbon constituting a hydrocarbon compound having a chain structure or a cyclic structure. By using the isocyanate having such a structure, it is possible to further reduce the residues when removing the protective film 15 by heating.

Figure 21A:
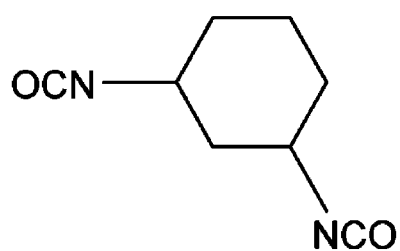
FIGS. 21A to 21C are views each illustrating another example of a structure of an isocyanate.
Figure 21B:
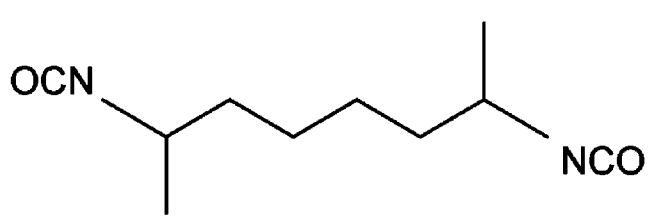
Figure 21C:
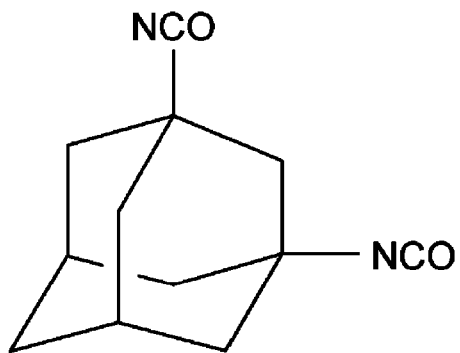

Although a monofunctional isocyanate having one isocyanate group is exemplified in FIG. 20, the effect of reducing residues is obtained even if the isocyanate is a bifunctional isocyanate having two isocyanate groups. As the bifunctional isocyanate having the basic skeleton exemplified in FIG. 20, for example, the structures illustrated in FIGS. 21A to 21C may be considered.

[Structural Isomer]

Figures 22, 23:
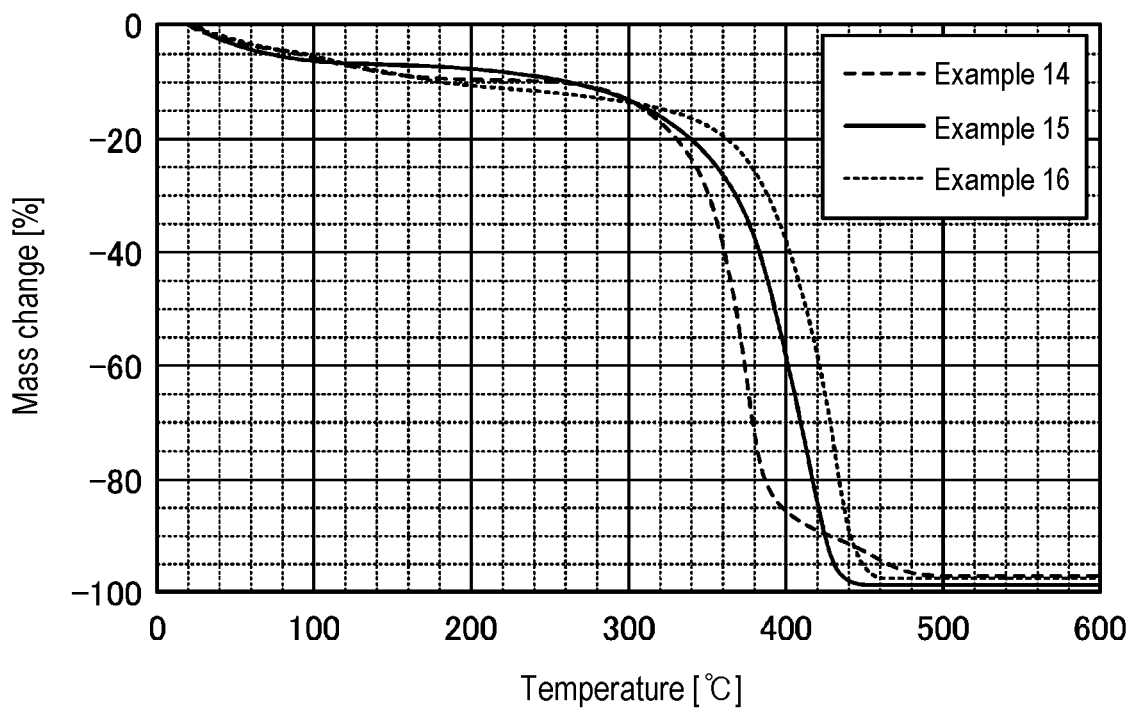
FIG. 22 is a view illustrating examples of combinations of an isocyanate and an amine in a case of containing a structural isomer and a case of not containing the structural isomer.
FIG. 23 is a view illustrating examples of mass changes of polymers with respect to a temperature.
Figure 24A:
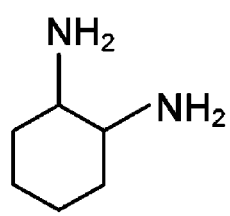
FIGS. 24A to 24F are views illustrating examples of a primary amine and a secondary amine.
Figure 24B:
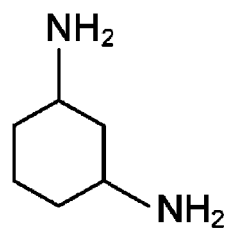
Figure 24C:
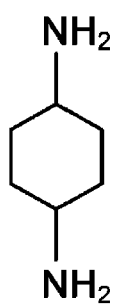
Figure 24D:
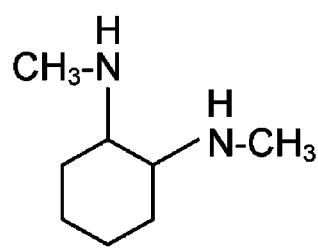
Figure 24E:
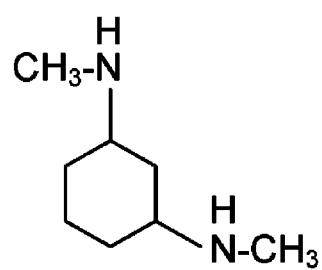
Figure 24F:
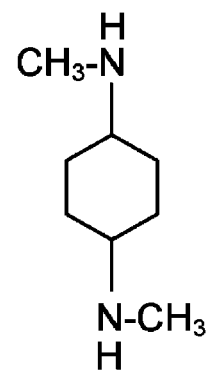

FIG. 22 is a view illustrating examples of combinations of an isocyanate and an amine in a case of containing a structural isomer and a case of not containing a structural isomer. In Example 14, structural isomers of cis- and trans-isomers are contained in each of the isocyanate and the amine. In Example 15, only the trans form of the structural isomers is contained in the isocyanate, and the cis form and the trans form of the structural isomers are contained in the amine. In Example 16, only the trans form of the structural isomers is contained in each of the isocyanate and the amine.

FIG. 23 is a view illustrating examples of mass changes of polymers with respect to a temperature. For example, as illustrated in FIG. 23, at around 400 degrees C., Example 14 containing structural isomers in both the isocyanate and the amine has a greater mass change than Examples 15 and 16 containing no structural isomer in at least one of the isocyanate and the amine. Therefore, at around 400 degrees C., Example 14 has less residues than Examples 15 and 16. Comparing Example 15 and Example 16, at around 400 degrees C., Example 15 containing a structural isomer in the amine has a greater mass change than Example 16 in which both the isocyanate and the amine do not contain a structural isomer. Accordingly, at around 400 degrees C., Example 15 has less residues than Example 16.

Here, it is known that structural isomers, especially trans isomers, have high crystallinity. Therefore, a polymer formed only of a monomer having only a trans form is considered to have high crystallinity. It is considered that the higher the crystallinity of the polymer, the higher the thermal energy required to break the crystal structure, resulting in an increase in the decomposition temperature of the polymer. Therefore, it is possible to remove the polymer formed by using the monomer containing the structural isomer at a lower temperature. That is, from the viewpoint of removal performance at a low temperature, Example 14 and Example 15 are preferable to Example 16, and Example 14 is preferable to Example 15. Therefore, it is preferable for the isocyanate to contain a structural isomer. Furthermore, it is preferable for the amine to contain a structural isomer.

Figure 25A:
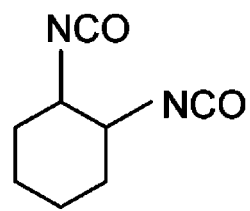
FIGS. 25A to 25C are views illustrating examples of an isocyanate having an isocyanate group containing a nitrogen atom bonded to a tertiary non-aromatic carbon.
Figure 25B:
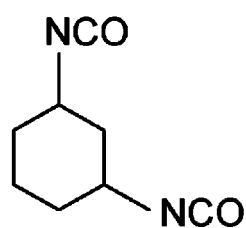
Figure 25C:
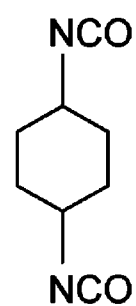

For example, as examples of preferable amine and isocyanate structures, for example, the structures illustrated in FIGS. 24A to 24F and FIGS. 25A to 25C are preferable. FIGS. 24A to 24F are views examples of a primary amine and a secondary amine. FIGS. 25A to 25C are views illustrating examples of isocyanates having an isocyanate group containing a nitrogen atom bonded to a tertiary non-aromatic carbon. The protective film 15 of a polyurea film is formed by using a combination of an amine having any of the structure exemplified in FIGS. 24A to 24F and an isocyanate having any of the structures exemplified in FIGS. 25A to 25C. The amines exemplified in FIGS. 24A to 24F and the isocyanates exemplified in FIGS. 25A to 25C are both assumed to be monomers containing structural isomers.

Embodiments have been described above. As described above, the semiconductor device manufacturing method according to the above-described embodiments include the forming step, the processing step, and the removing step. In the forming step, the protective film 15 is formed on the surface of the substrate W, wherein the protective film 15 is provided in the specific region of the substrate W by supplying the amine and the isocyanate to the surface of the substrate W, and is made of a polymer having a urea bond. In the processing step, the predetermined process such as etching is performed on the substrate W on which the protective film 15 is formed. In the removing step, the protective film 15 is removed by heating the substrate W to depolymerize the polymer. The carbon bonded to the nitrogen atom contained in the isocyanate group of the isocyanate is a secondary or tertiary non-aromatic carbon. This makes it possible to reduce residues when the protective film 15 is removed by heating.

In the above-described embodiments, the carbon bonded to the nitrogen atom contained in the isocyanate group is a carbon of a hydrocarbon compound having a chain structure or a cyclic structure. The amine is a secondary amine. This makes it possible to reduce residues when the protective film 15 is removed by heating.

In the above-described embodiments, in the removing step, the substrate W is heated to a temperature within the range of 400 degrees C. to 500 degrees C. This makes it possible to reduce the influence on other heat-sensitive structures such as a wiring material provided on the substrate W in removing the protective film 15.

In the above-described embodiments, it is preferable for the isocyanate not to contain a structural isomer. This makes it possible to further reduce residues when the protective film 15 is removed by heating.

In the above-described embodiments, the amine may be a bifunctional amine having two secondary amine functional groups. Even when such an amine is used, it is possible to reduce residues when the protective film 15 is removed by heating.

In the above-described embodiment, the isocyanate may be a bifunctional isocyanate having two isocyanate groups. Even when such an amine is used, it is possible to reduce residues when the protective film 15 is removed by heating.

The manufacturing system 10 for manufacturing the semiconductor device in the above-described embodiments includes the second film forming apparatus 4, the etching apparatus 5, and the heat treatment apparatus 6. The second film forming apparatus 4 forms the protective film 15 made of a polymer having a urea bond by supplying an amine and an isocyanate to the surface of the substrate W, wherein the protective film 15 is provided in the specific region of the substrate W. The etching apparatus 5 performs the predetermined process such as etching on the substrate W on which the protective film 15 is formed. The heat treatment apparatus 6 removes the protective film 15 by heating the substrate W subjected to the predetermined process to depolymerize the polymer. The carbon bonded to the nitrogen atom contained in the isocyanate group of the isocyanate is a secondary or tertiary non-aromatic carbon. This makes it possible to reduce residues when the protective film 15 is removed by heating.

In the above-described embodiments, the heat treatment apparatus 6 heats the substrate W to a temperature within the range of 400 degrees C. to 500 degrees C. This makes it possible to reduce the influence on other heat-sensitive structures such as a wiring material provided on the substrate W in removing the protective film 15.

[Others]

The technology disclosed herein is not limited to the embodiments described above, and various modifications are possible within the scope of the gist the present disclosure.

For example, it is possible combine the above-described first and second embodiments. Specifically, the protective film 15 may be formed by using an isocyanate in which the carbon bonded to the nitrogen atom contained in the isocyanate group is a secondary or tertiary non-aromatic carbon and a secondary amine. This makes it possible to further reduce residues when the protective film 15 is removed by heating.

In the above-described embodiments, the protective film 15 of the polymer having a urea bond is used as an etching stopper in a memory element manufacturing process. However, the disclosed technique is not limited thereto. If the polymer having a urea bond is used as a sacrificial film, the protective film 15 may also be used to form an air gap. For example, the protective film 15 is embedded in a recess provided in the substrate W, and a sealing film is laminated on the protective film 15 in the recess. Then, when the substrate W is heated, the protective film 15 is depolymerized into monomers, and the monomers are removed from the recess via the sealing film. As a result, an air gap is formed between the sealing film and the recess.

According to various aspects and embodiments of the present disclosure, it is possible to reduce residues in the removal of a sacrificial film.

It shall be understood that the embodiments disclosed herein are examples in all respects and are not restrictive. Indeed, the above-described embodiments can be implemented in various forms. The embodiments described above may be omitted, replaced, or modified in various forms without departing from the scope and spirit of the appended claims.

What is claimed is:

1. A method of manufacturing a semiconductor device, the method comprising:
   forming a sacrificial film made of a polymer having a urea bond on a substrate by supplying an amine and an isocyanate to a surface of the substrate, wherein the sacrificial film is provided in a specific region of the substrate;
   performing a predetermined process on the substrate on which the sacrificial film is formed; and
   removing the sacrificial film by heating the substrate to depolymerize the polymer,
   wherein a carbon bonded to a nitrogen atom contained in an isocyanate group of the isocyanate is a secondary or tertiary non-aromatic carbon.

2. The method of claim 1, wherein the carbon bonded to the nitrogen atom contained in the isocyanate group is a carbon constituting a hydrocarbon compound having a chain structure or a cyclic structure.

3. The method of claim 1, wherein the amine is a secondary amine.

4. The method of claim 1, wherein, in the removing the sacrificial film, the substrate is heated to a temperature in a range of 400 degrees C. to 500 degrees C.

5. The method of claim 1, wherein the isocyanate contains a structural isomer.

6. The method of claim 1, wherein the amine contains a structural isomer.

7. The method of claim 1, wherein the amine is a bifunctional amine having two secondary amine functional groups.

8. The method of claim 1, wherein the isocyanate is a bifunctional isocyanate having two isocyanate groups.

9. The method of claim 2, wherein the amine is a secondary amine.

10. The method of claim 9, wherein, in the removing the sacrificial film, the substrate is heated to a temperature in a range of 400 degrees C. to 500 degrees C.

11. A system for manufacturing a semiconductor device, the system comprising:
    a film forming apparatus configured to form a sacrificial film made of a polymer having a urea bond on a substrate by supplying an amine and an isocyanate to a surface of the substrate, wherein the sacrificial film is provided in a specific region of the substrate;
    a processing apparatus configured to perform a predetermined process on the substrate on which the sacrificial film is formed; and
    a heat treatment apparatus configured to remove the sacrificial film by depolymerizing the polymer by heating the substrate subjected to the predetermined process,
    wherein a carbon bonded to a nitrogen atom contained in an isocyanate group of the isocyanate is a secondary or tertiary non-aromatic carbon.

12. The system of claim 11, wherein the carbon bonded to the nitrogen atom contained in the isocyanate group is a carbon constituting a hydrocarbon compound having a chain structure or a cyclic structure.

13. The system of claim 11, wherein the amine is a secondary amine.

14. The system of claim 11, wherein the heat treatment apparatus heats the substrate at a temperature in a range of 400 degrees C. to 500 degrees C.

15. The system of claim 11, wherein the isocyanate contains a structural isomer.

16. The system of claim 11, wherein the amine contains a structural isomer.

17. The system of claim 11, wherein the amine is a bifunctional amine having two secondary amine functional groups.

18. The system of claim 11, wherein the isocyanate is a bifunctional isocyanate having two isocyanate groups.

19. The system of claim 12, wherein the amine is a secondary amine.

20. The system of claim 19, wherein the heat treatment apparatus heats the substrate at a temperature in a range of 400 degrees C. to 500 degrees C.

* * * * *